United States Patent
Anzai (10) Patent No.: US 7,268,427 B2
(45) Date of Patent: Sep. 11, 2007

(54) SEMICONDUCTOR PACKAGE, PRINTED BOARD MOUNTED WITH THE SAME, AND ELECTRONIC APPARATUS HAVING THE PRINTED BOARD

(75) Inventor: Hisao Anzai, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 71 days.

(21) Appl. No.: 11/003,402

(22) Filed: Dec. 6, 2004

(65) Prior Publication Data
US 2006/0033202 A1 Feb. 16, 2006

(30) Foreign Application Priority Data
Aug. 10, 2004 (JP) ............ 2004-232921

(51) Int. Cl.
*H01L 23/10* (2006.01)
*H01L 23/34* (2006.01)

(52) U.S. Cl. .............. 257/707; 257/E23.102; 257/706; 257/712; 257/718; 257/719; 438/122

(58) Field of Classification Search ........ 257/E23.087, 257/E23.098, E23.102, 706, 707, 718, 719, 257/722, 712, 778; 438/122
See application file for complete search history.

(56) References Cited

U.S. PATENT DOCUMENTS

| | | | | |
|---|---|---|---|---|
| 5,213,868 A | * | 5/1993 | Liberty et al. | 428/131 |
| 5,818,103 A | * | 10/1998 | Harada | 257/676 |
| 6,025,213 A | * | 2/2000 | Nemoto et al. | 438/122 |
| 6,114,761 A | * | 9/2000 | Mertol et al. | 257/722 |
| 6,317,326 B1 | * | 11/2001 | Vogel et al. | 361/704 |
| 6,426,877 B1 | * | 7/2002 | Baba | 361/760 |
| 6,448,575 B1 | * | 9/2002 | Slocum et al. | 257/48 |
| 6,472,762 B1 | * | 10/2002 | Kutlu | 257/778 |
| 6,607,942 B1 | * | 8/2003 | Tsao et al. | 438/122 |
| 6,830,960 B2 | * | 12/2004 | Alcoe et al. | 438/122 |
| 7,009,291 B2 | * | 3/2006 | Oohama | 257/712 |
| 2001/0045643 A1 | * | 11/2001 | Katoh et al. | 257/706 |

FOREIGN PATENT DOCUMENTS

| | | |
|---|---|---|
| JP | 62-183150 | 8/1987 |
| JP | 2-47895 | 2/1990 |
| JP | 6-169037 | 6/1994 |
| JP | 2002-184914 | 6/2002 |

* cited by examiner

Primary Examiner—Kenneth Parker
Assistant Examiner—Chris C. Chu
(74) Attorney, Agent, or Firm—Kratz, Quintos & Hanson, LLP (57) ABSTRACT

A holding fixture that holds a component and mounts the component on an electronic circuit board includes a holding member that holds the component at a side of a first surface of the electronic circuit board, a first fixing member that includes a first base that is engageable with the holding member, and an elastic member that is pivotally attached to the base, sandwiches the electronic circuit board at a side of a second surface of the electronic circuit board, and elastically supports the holding member at the side of the first surface, the second surface opposing to the first surface, and a second fixing member that includes a second base that is engageable with the holding member, and a projection member that projects from the second surface of the electronic circuit board and is engageable with the elastic member.

12 Claims, 7 Drawing Sheets

SEMICONDUCTOR PACKAGE, PRINTED BOARD MOUNTED WITH THE SAME, AND ELECTRONIC APPARATUS HAVING THE PRINTED BOARD

This application claims the right of foreign priority under 35 U.S.C. §119 based on Japanese Patent Application No. 2004-232921, filed Aug. 10, 2004, which is hereby incorporated by reference herein in its entirety as if fully set forth herein.

BACKGROUND OF THE INVENTION

1. Field of the Invention

The present invention relates generally to a heat radiating mechanism, and more particularly to a heat radiating mechanism that transmits the heat generated from an exoergic circuit element (referred to as "exoergic element" hereinafter) mounted on an electronic apparatus. The present invention is suitable, for example, for a heat spreader that radiates heat from a CPU mounted on a printed board (also referred to as a "system board" or "motherboard") in a personal computer (referred to as "PC" hereinafter). Here, the "heat spreader" is a metal plate that efficiently transmits the heat from the exoergic element to the outside.

2. Description of the Related Art

A Ball Grid Array ("BGA") package, one type of package board soldered to the printed board, has conventionally been proposed in order to meet recently increasing demands for supplies of high-performance electronic apparatuses. The BGA package realizes a narrower pitch and more pins (i.e., high-density leads) without enlarging the package than a Quad Flat Package ("QFP") that has the Gullwing type leads at four sides. Thus, the BGA package provides the high-performance electronic apparatus through the high density of the package.

The BGA package is mounted with an IC and an LSI that generally serve as a CPU, and the improved performance and larger size of the LSI swells the calorific value, for example, up to 100 W to 150 W. Accordingly, in order to thermally protect the electronic circuit in the LSI, a radiator called a heat sink is thermally connected to the LSI via a heat spreader. The heat sink has cooling fins, is located near the CPU, and radiates the LSI through natural cooling. Use of a material having a high coefficient of thermal conductivity (e.g., about $16.5 \times 10^{-6}/°$ C.), such as copper, for the heat spreader would result in a significant difference in the coefficient of thermal conductivity between the heat spreader and the LSI made of silicon (which has a coefficient of thermal conductivity of about $4.2 \times 10^{-6}/°$ C.). In addition, there is also a significant difference in thickness between them because the LSI has a thickness of several hundred microns whereas the heat spreader has a thickness of several millimeters.

Prior art includes, for example, Japanese Patent Applications, Publication Nos. 6-169037, 2-47895, 62-183150 and 2002-184914, and Japanese Utility-Model Application, Publication No. 2-101535.

A jointing layer joints the LSI to the heat spreader, and is typically made of a material having no elasticity, such as epoxy resin and solder. For example, a Cu heat spreader is arranged on an Si chip via a heat-hardening adhesive as a jointing layer, and the jointing layer is hardened, for example, at 150° C. and then returned to room temperature. Then, the heat spreader and the LSI generate thermal strains, but the heat spreader is thicker than the LSI and difficult to deform in the thickness direction. Therefore, a large thermal stress is applied to the LSI. which can break the LSI and the jointing layer. In particular, the influence of the thermal stress applied to the LSI becomes conspicuous for the increased chip size.

One conceivable solution for this problem is to use for the jointing layer an elastic adhesive, such as a silicon adhesive, or a sheet or paste jointing material. However, the metallic jointing material, such as solder, has a coefficient of thermal conductivity of about 40 W/° C.·m, whereas these materials have such a small coefficient of thermal conductivity as 1 to 2 W/° C.·m, lowering the radiation efficiency of the CPU. The non-operating LSI can endure the temperature up to about 200° C., but the operating LSI's electronic circuit should be maintained at about 100° C. and protected thermally. The low radiation efficiency would cause the operating LSI's temperature to exceed 100° C. and possibly result in the thermal breakdown of the electronic circuit. In particular, as the CPU has recently increased the calorific value, it is undesirable to use the jointing material having a low coefficient of thermal conductivity for the CPU and the heat spreader.

SUMMARY OF THE INVENTION

Accordingly, the instant application discloses a semiconductor package, a printed board having the semiconductor package, and an electronic apparatus, which thermally protects the exoergic element and jointing layer as a result of the thermal stress associated with the junction with the heat spreader, while maintaining the heat radiation effect for the exoergic element.

A semiconductor package according to instant application that can be mounted on a printed board includes a package board that is mounted with an exoergic circuit element, a heat spreader that transmits heat from the exoergic circuit element, and a jointing layer that joints the exoergic circuit element to the heat spreader and is made of a solid jointing material that has substantially no elasticity, wherein the heat spreader includes a first surface jointed to the exoergic circuit element, and a second surface as a rear surface of the first surface, and wherein the heat spreader has a slit that extends in a substantially radial direction from an inner side to an outer side with respect to a first area that is jointed to the exoergic circuit element on the first surface or a second area that is an orthogonal projection of the first area onto the second surface, when the heat spreader is transparently viewed from the first or second surface. The slits enables the heat spreader of the semiconductor package to easily deform, and reduces the residue stress that affects the exoergic circuit element after the jointing layer made of a epoxy resin or another metal jointing material, such as solder, is hardened. On the other hand, the metal jointing material, such as solder, which has a large coefficient of thermal conductivity strongly adheres the exoergic circuit element made of silicon, etc. to the heat spreader made of copper having a large coefficient of thermal conductivity, and improve the heat radiation efficiency.

Preferably, plural slits are arranged substantially symmetrical with respect to a center of the exoergic circuit element, substantially like a cross or an asterisk shape. The symmetry can prevent the stress from partially concentrating on the exoergic circuit element. The slit may perforate through the heat spreader. Because the slit assists the heat spreader in deforming, its shape, size and the number are not limited as long as the heat radiation efficiency can be maintained. In other words, as the slit area becomes larger, the heat spreader becomes easily deformable. However, it is preferable that the slit is spaced from a center of the exoergic circuit element by a predetermined distance. This is because that the center of the exoergic circuit element is generally a heat source, and the heat radiation effect can deteriorate greatly if the slit is formed in the center.

Preferably, the slit substantially follows beat flux of the heat, formed on the heat spreader, because the heat radiation effect can deteriorate greatly if the slit crosses the heat flux for radiating the exoergic circuit element. If the package board is mounted with plural exoergic circuit elements the heat spreader is commonly used for the plural exoergic circuit elements, the heat flux is a composite heat flux formed on the heat spreader by the plural exoergic circuit elements.

The heat spreader may serve as part of a heat sink that naturally radiates the heat. Alternatively, the semiconductor package may further include a heat sink that naturally radiates the heat, and the heat spreader may be jointed to the heat sink so that the heat spread can deform. A joint between the heat spreader and the heat sink can use the grease, etc. When the heat spreader is strongly adhered to the heat sink, the heat spreader becomes hard to deform consequently, and the thermal stress received by the exoergic circuit element cannot be reduced. The semiconductor package has, for example, a BGA structure. A printed board mounted with the above semiconductor package and an electronic apparatus including the above printed board also constitute one aspect of the present invention.

Other objects and further features of the present invention will become readily apparent from the following description of the preferred embodiments with reference to accompanying drawings.

DETAILED DESCRIPTION OF THE PREFERRED EMBODIMENTS

Figure 1:
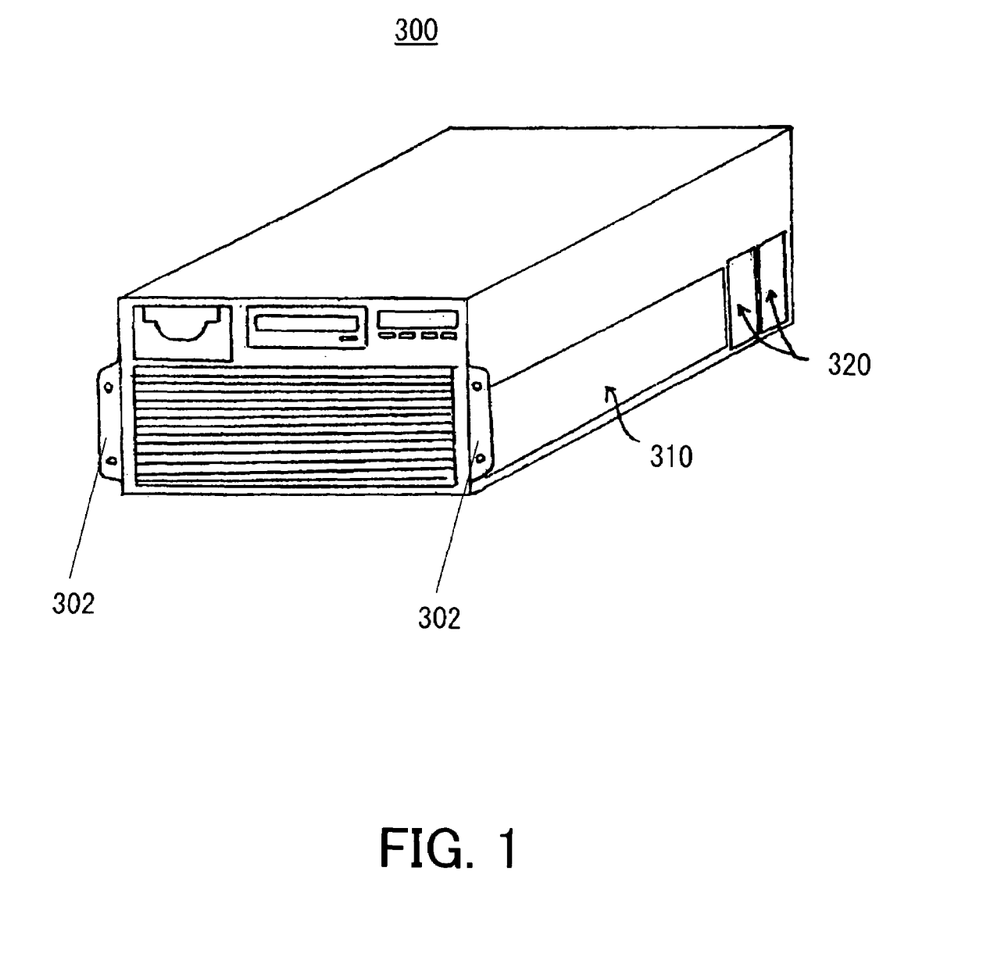
FIG. 1 is a schematic perspective view of an electronic apparatus according to the present invention.
Figure 2:
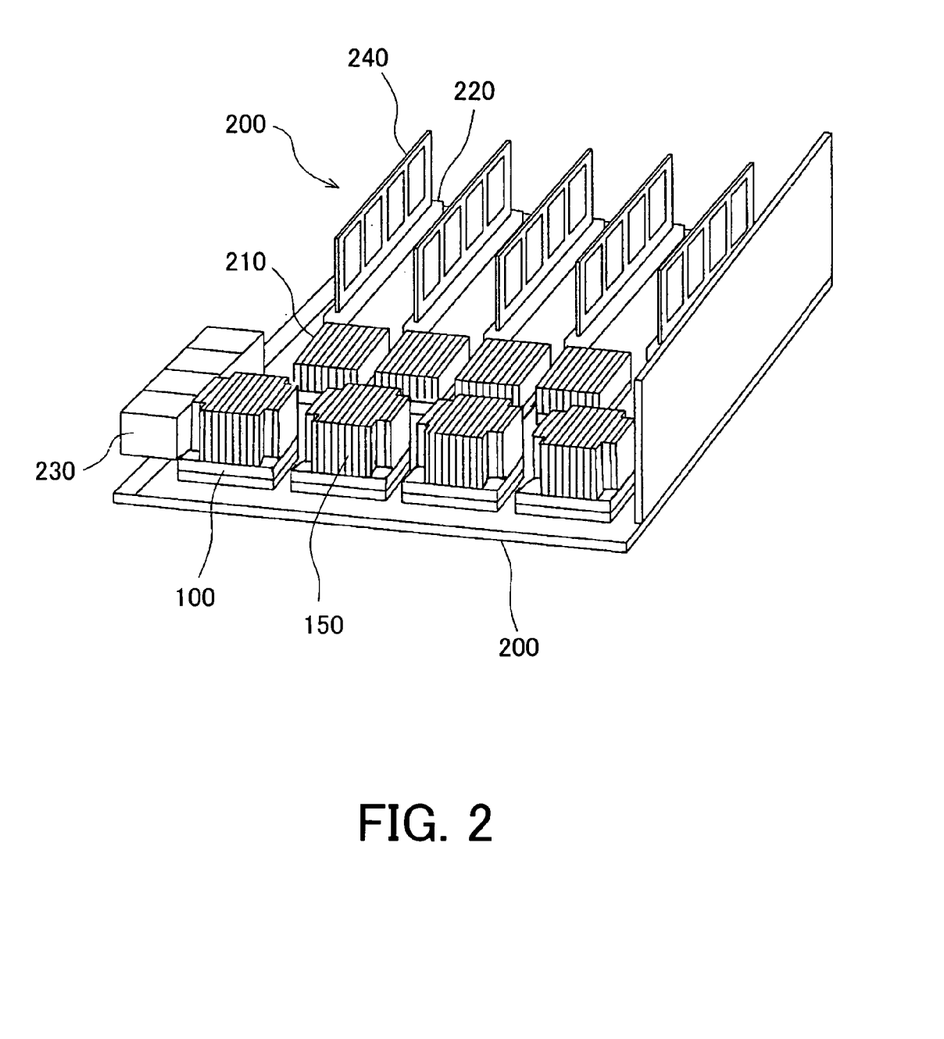
FIG. 2 is a schematic perspective view showing an internal structure of the electronic apparatus shown in FIG. 1.

Referring now to accompanying drawings, a description will be given of a package module 100 as a semiconductor package according to one embodiment of the present invention, a printed circuit board 200 mounted with the package module 100, and an electronic apparatus 300 that includes the printed circuit board 200. Here, FIG. 1 is a schematic perspective view of the electronic apparatus 300. FIG. 2 is a perspective overview of a system board used as the printed circuit board 200 included in the electronic apparatus 300.

As shown in FIG. 1, the electronic apparatus 300 of the instant embodiment is exemplarily implemented as a rack mount type UNIX server. The electronic apparatus 300 is screwed onto a rack (not shown) by a pair of attachment parts 302, and includes the printed circuit board 200 shown in FIG. 2 in a housing 310.

The housing 310 is provided with a fan module 320, which rotates a built-in cooling fan to generate airflow to cool a heat sink 150, to which a heat spreader 140 is connected, which will be described later. The fan module 320 has a power section (not shown), and a propeller section (not shown) fixed onto the power section. The power section may use any structure known in the art, which typically includes a rotary shaft, a bearing around the rotary shaft, a bearing house, a magnet for a motor, etc., and a detailed description thereof will be omitted. The propeller section includes a number of angled, isogonally or non-isogonally arranged rotors, which have a predetermined size. The power section and the propeller section may or may not be separable.

As shown in FIG. 2, the printed circuit board 200 includes a package module 100, an LSI module 210 around the package module, a plurality of block plates 220 for receiving a plurality of memory cards 240, and a connector 230 for an external device, such as a hard disc and a LAN.

Figure 3:
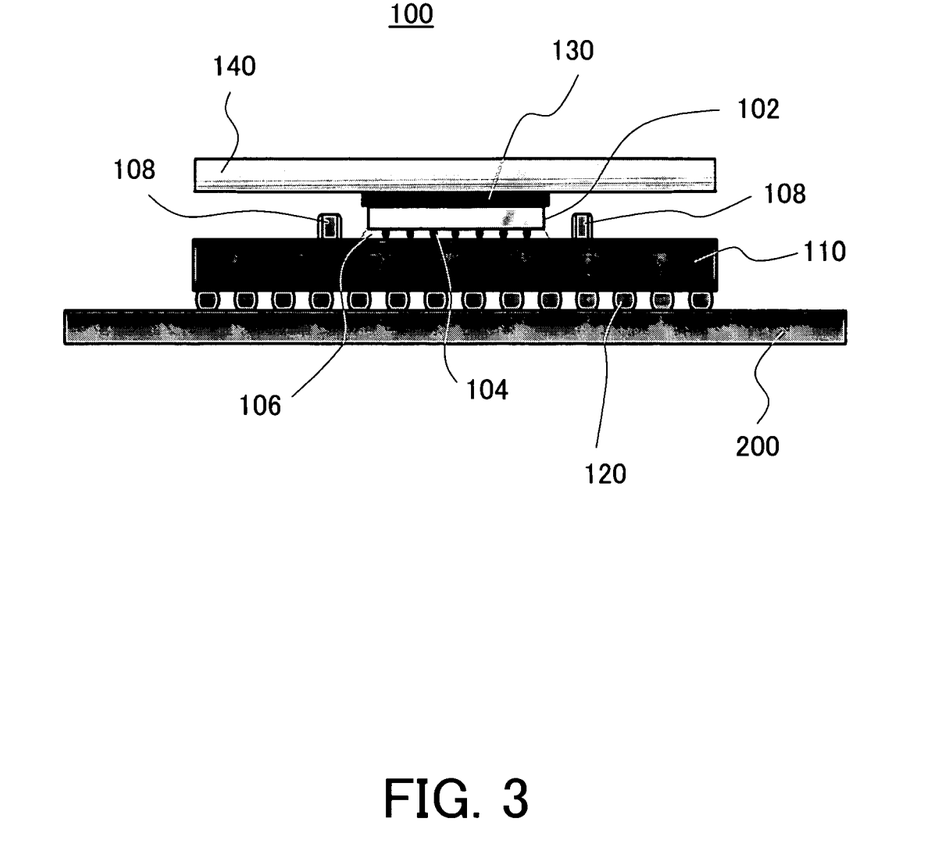
FIG. 3 is a schematic perspective view showing a package module shown in FIG. 2.

The package module 100 serves as a BGA package that is mounted with a CPU 102 and connected to the printed circuit board 200 via BGAs 120. More specifically, the package module 100 includes, as shown in FIGS. 2 and 3, a package board 110, BGAs 120, a jointing layer 130, a heat spreader 140 and a heat sink 150. Here, FIG. 3 is a schematic sectional view of the package module 100 shown in FIG. 2, although FIG. 3 omits the heat sink 150.

The package board 110 is made, for example, of ceramic, because ceramic and the CPU 102 have such similar coefficients of thermal conductivity that the CPU 102 and the package board 110 do not deform when the CPU 102 is mounted onto the package board 110. Alternatively, the package board 110 may be made of resin, because the resin board is thinner than a ceramic board, and thus the resin board is superior in electric characteristics to, less expensive than, and more easily processed than the ceramic board.

The package board 110 is mounted with the CPU 102 made of an LSI and another circuit element 108, such as a capacitor, on its top surface, and the BGAs 120 on its bottom surface. Of course, this configuration is illustrative. For example, the circuit element 108 may be mounted on the bottom surface of the package board 110. While the package board 110 of the instant embodiment is a single chip type mounted with one CPU 102, the present invention does not exclude a multi-chip type package board that is mounted with plural CPUs 102.

The CPU 102 is an LSI (or an exoergic element) soldered to the package board 110 by bumps 104 as terminals, and resin underfill 106 that is usually used for a flip chip (or a chip that has bumps) is filled between the CPU 102 and the package board 110 to seal the bumps 104 and maintain connection reliability of the bumps 104.

The BGA 120 is a ball-shaped soldering bump (or a soldering ball) and is arranged at a connection portion between the package board 110's bottom surface and the printed board 200. In other words, the BGA 120 serves as a terminal and is connected to the printed board 200 strongly by soldering balls (or solder). The BGA package thus uses the BGAs for connections instead of the leads provided at four sides of the QFP package. The BGA package can narrow the pitch between terminals, arrange many terminals, and realize the high density, high performance and miniaturization without enlarging the package. The BGA 120 may arrange soldering bumps on the entire bottom surface of the package board 110, or arrange soldering bumps in an approximately square shape having an approximately square hollow if there is the circuit element 108 on the bottom surface of the package board 110. The heat spreader 140 of this embodiment is suitable for the BGA package, because the BGA package often makes the heat spreader of a material different from that for the LSI.

If necessary, the reinforcing metal is provided on the top surface of the package board and reinforces the package board. The reinforcing metal straightens the torsion of the package board 110, and is made, for example, of aluminum, copper, etc.

The jointing layer 130 strongly joints the CPU 102 to the heat spreader 140. The jointing layer 130 is made of a jointing material that has a high coefficient of thermal conductivity and substantially no elasticity, such as epoxy resin high thermal conductive adhesive and solder. The jointing layer 130 strongly adheres the CPU 102 to the heat spreader 140, and efficiently transmits the heat from the CPU 102 to the heat spreader 140. The jointing layer 130 never prevents occurrence of a temperature gap between the CPU 102 and the heat spreader 140.

The heat spreader 140 is arranged between the package board 110 and the heat sink 150, and connected to the CPU 102 via the jointing layer 130. The heat spreader 140 serves to transmit the heat from the CPU 102 to the heat sink 150, and is made of a material having a high coefficient of thermal conductivity, such as copper, aluminum carbide, aluminum, aluminum silicon carbide (aluminum that contains silicon), silicon carbide.

Figure 4A:
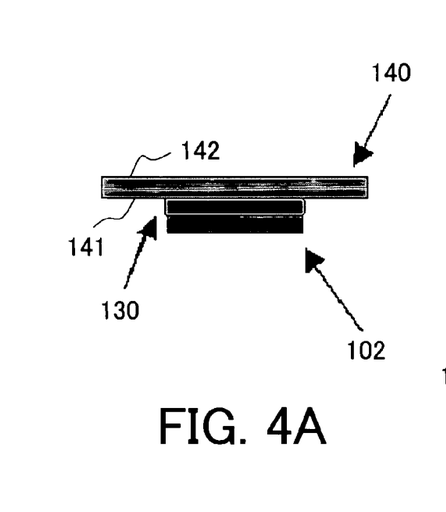
FIG. 4A is a schematic sectional view of a CPU, jointing layer and heat spreader shown in FIG. 2.
Figure 4B:
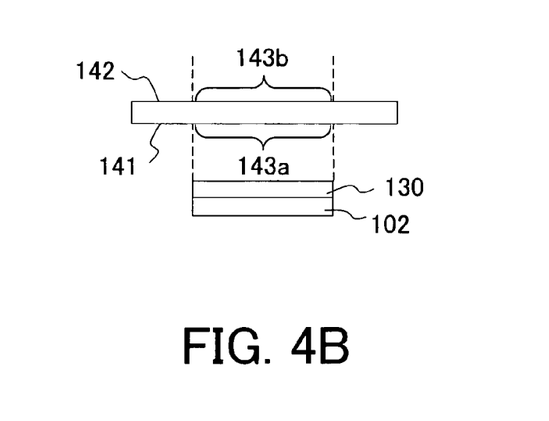
FIG. 4B is a partially exploded sectional view of FIG. 4A.
Figure 4C:
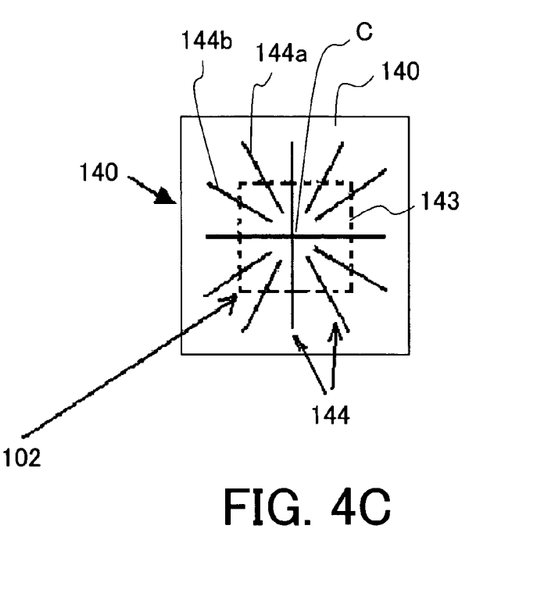
FIG. 4C is a transparent plane view of a heat spreader.

The heat spreader 140 has a surface 141 jointed to the CPU 102, and a surface 142 as a rear surface of the surface 141. As shown in FIGS. 4B and 4C, the heat spreader 140 has slit 144, each of which extends in a radial direction from an inner side to an outer side with respect to an area 143a that is jointed to the CPU 102 on the first surface 141 or a second area 143b that is an orthogonal projection of the area 143a onto the second surface 142, when the heat spreader 140 is transparently viewed from the first surface 141 or the second surface 142. Here, FIG. 4A is a schematic sectional view showing a joint state of the CPU 102, the jointing layer 130, and the heat spreader 140. FIG. 4B is a partially exploded sectional view that separates the CPU 102 and the jointing layer 130 from the heat spreader 140 in FIG. 4A so as to illustrate the areas 143a and 143b. FIG. 4C is a transparent plane view of a heat spreader 140 viewed from the surface 141 or 142. The areas 143a and 143b are the same when viewed from the surface 141 or 142 transparently, and FIG. 4C encloses the area 143 by a broken line.

The heat spreader 140 has a thickness, for example, of several millimeters although FIGS. 3 and 4A-4C exaggerate the heat spreader 140 for illustration convenience. The CPU 102 has a thickness, for example, of 300 μm to 600 μm. The heat spreader 140 is made of a material having a high coefficient of thermal conductivity, such as copper that has a coefficient of thermal conductivity of about $16.5 \times 10^{-6}/°$ C., and a difference in coefficient of thermal conductivity is very significant between the heat spreader 140 and the CPU 102 made of silicon (which has a coefficient of thermal conductivity of about $4.2 \times 10^{-6}/°$ C.).

Therefore, when the package is heated up to 150° C. and then returned to the room temperature in order to harden the jointing layer 130, the large thermal stress is applied to the CPU 102 as a result of a difference between the thermal shrinkage and coefficient of thermal conductivity of the heat spreader 140. In particular, the heat spreader 140 is thicker than the CPU 102, and less easily deforms than the CPU 102 in the thickness direction. This causes a problem in that a large thermal stress is applied to the CPU 102, and breaks the CPU 102 and the jointing layer 130. The influence of the thermal stress applied to the CPU 102 becomes conspicuous for a large chip size of 10 mm to 20 mm.

One conceivable solution for this problem is use for the jointing layer 130 an elastic adhesive, such as a silicon adhesive, or a sheet or paste jointing material. However, these materials have smaller coefficients of thermal conductivity or larger thermal resistances than the metallic jointing material, lowering the radiation efficiency of the CPU. The non-operating CPU 102 can endure a temperature up to about 200° C., but the operating CPU 102's electronic circuit should be maintained at about 100° C. and protected thermally. The low radiation efficiency would cause the operating LSI's temperature to exceed 100° C. and possibly result in thermal breakdown of the electronic circuit. In particular, along with the calorific value of the CPU recently increasing to 100 W to 150 W, it is not preferable to joint the CPU 102 to the heat spreader 140 with an adhesive having a low coefficient of thermal conductivity.

Accordingly, this embodiment makes the jointing layer 130 of a jointing material having a coefficient of thermal conductivity, and maintains the radiation efficiency. On the other hand, this embodiment provides the heat spreader 140 with the slits 144 so as to make the heat spreader 140 easily deformable in a surface direction, reducing the influence of the thermal stress applied to the CPU 102.

As a result, the operating CPU 102's electronic circuit is protected from thermal breakdown, and the CPU 102 and the jointing layer 130 are protected from breakdown as a result of the thermal distortion break at the jointing time between the CPU 102 and the heat sink 140.

Figure 5A:
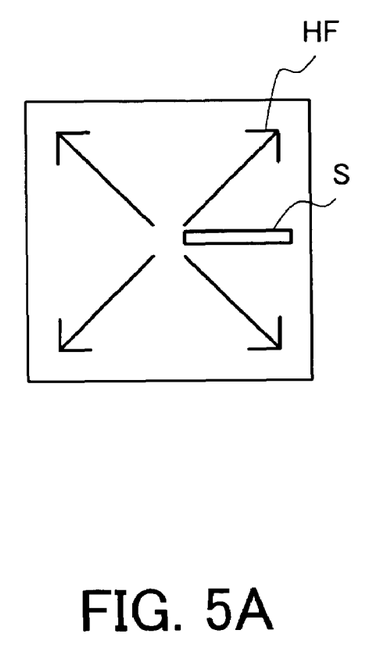
FIGS. 5A and 5B are schematic plane views showing a relationship between the heat flux and slits on the heat spreader.
Figure 5B:
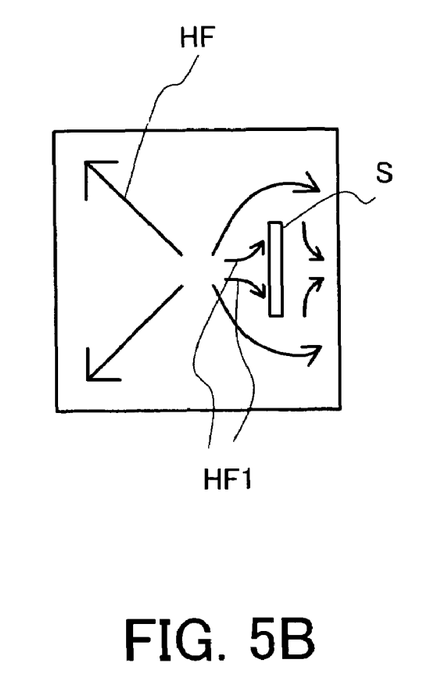

The slits 144 extend in radial directions, as shown in FIG. 4C, from the center C of the CPU 102, because the heat flux HF approximately extends in the radial direction from the center of the CPU 102 as a heat source. Here, FIGS. 5A and 5B are schematic plane views showing a relationship between the heat flux HF from the heat source and the slit S.

The heat spreader 140 spreads the heat from the CPU 102. The heat spread is precluded on the heat spreader 140 as the heat flux is obstructed. In other words, in order to maintain the radiation efficiency of the CPU 102, it is necessary to form the slit 144 without obstructing the heat flux. When the slit S is arranged as shown in FIG. 5B, the heat flux HF1 is obstructed and the effective heat radiation from the CPU is interrupted. The term "radial" in the instant specification does not necessarily mean a line that extends straightforward from the center but covers an eddy and other shapes as long as the shape follows the heat flux.

While the instant embodiment regards the heat source as the center of the CPU 102, the heat source actually has a certain area and the heat flux formed by the heat from the CPU 102 does not perfectly extend in a radial direction from the center of the CPU 102. Therefore, it is necessary to calculate the heat flux using a simulation, experiment, etc., and then to determine an effective arrangement of the slit(s). Of course, the present invention does not require the slit's shape and arrangement to perfectly accord with the heat flux, in light of the fact that the manufacturing convenience does not permit a complexly shaped slit.

In addition, the present invention does not require the extension line to pass the center C of the CPU 102. For example, the extension lines of the slits 144a and 144b can intersect at a position apart from the center C by a predetermined distance in FIG. 4C. In this context, it is sufficient that the slit extends in an approximately radial direction from the center C of the CPU 102. The phrase "approximately radial" means that the slit is arranged along the heat flux and the number of heat fluxes cut by the slit is small. The slit is preferably formed along the heat flux and the heat flux generally extends from the center to the outside but its extending direction may not perfectly accord with the radial direction. The phrase "approximately radial" covers a case in which the heat flux does not perfectly extend in the radial direction as long as the slit follows the heat flux. That "the number of heat fluxes cut by the slit is small" means that an angle between the slit and the heat flux is within 45°, preferably within 30°. The angle between the slit and the heat flux of 45° cuts about 50% of the heat flux, and the angle between the slit and the heat flux of 30° cuts about 33% of the heat flux.

The slits are arranged substantially symmetrical with respect to the center C of the CPU 102, like a substantially cross or asterisk shape or every 30° intervals. The symmetry can prevent the stress from partially concentrating on the CPU 102. For example, when the slits 144 are formed only at the right side of the heat spreader shown in FIG. 4C, the thermal stress does not reduce at the left side of the CPU 102.

Of course, when the heat flux is not formed symmetrically and biased, the slits 144 can be formed asymmetrically. For example, the heat flux appears asymmetrically when the package board 110 has a deviation in its temperature distribution, for example, if the package board 110 is mounted with plural CPUs or includes a CPU and another package board 110 mounted with another CPU adjacently.

The slits 144 extend, as shown in FIG. 4C, from the inner side to the outer side of the area 143. In other words, the slit 144 extends across the outline that defines the area 143. The area 143 is an area 143a jointed to the CPU 102 or the area 143b as a rear surface of the area 143a, and the CPU 102 generally receives the thermal stress from the heat spreader. It is undesirable that the slit 144 extends from the inside of the area 143 only to the outline of the area 143, i.e., not to the outside of the area 143, because the stress concentrates on the outline.

The slit 144 does not necessarily extend to the outline of the heat spreader 140 outside the area 143, because the CPU 102 is not jointed to the heat spreader 140 outside the area 143 and does not receive the thermal stress from the heat spreader 140 in this area. Of course, the present invention does not preclude the slit 144 from extending to the outline of the heat spreader 140. The length by which the slit 144 extends from the outline of the area 143 outside the area 143 is determined by a simulation or an experiment based on the calorific value and size of the CPU 102 and the material and size of the heat spreader 140.

The slit 144 may or may not perforate through the heat spreader 140. In this specification, the term "slit" covers both situations. The non-perforating slit 144 may be provided only at the side of the surface 141 or 142 or in both surfaces. The slit 144 may perforate through the surfaces 141 and 142 obliquely. The perforating and non-perforating slits 144 may exist at the same time.

Because the slit 144 assists the heat spreader 140 in deforming, its shape and size and the number of slits are not limited as long as the necessary heat radiation efficiency can be maintained. The large slit area would facilitate the deformation of the heat spreader 140, but the heat radiation would deteriorate in the slit area. A shape of the slit 144 is not limited, and the slit 144 does not have to be an elongated hole or groove. For example, the slit 144 may have a circular or sectorial shape in FIG. 4C. The slit 144 does not have the constant depth. For example, the slit 144 is deeper in FIG. 4C as a distance between the slit and the center C increases.

The slit 144 is formed, for example, by punching a copper sheet.

It is preferable that the slit 144 is spaced from the center C of the CPU 102 by a predetermined distance, as shown in FIG. 4C. This is because a circle that has a certain radius and a center at the center C of the CPU 102 is generally a heat source and the heat radiation effect can deteriorate greatly if the slit is formed within this circle.

Figure 6:
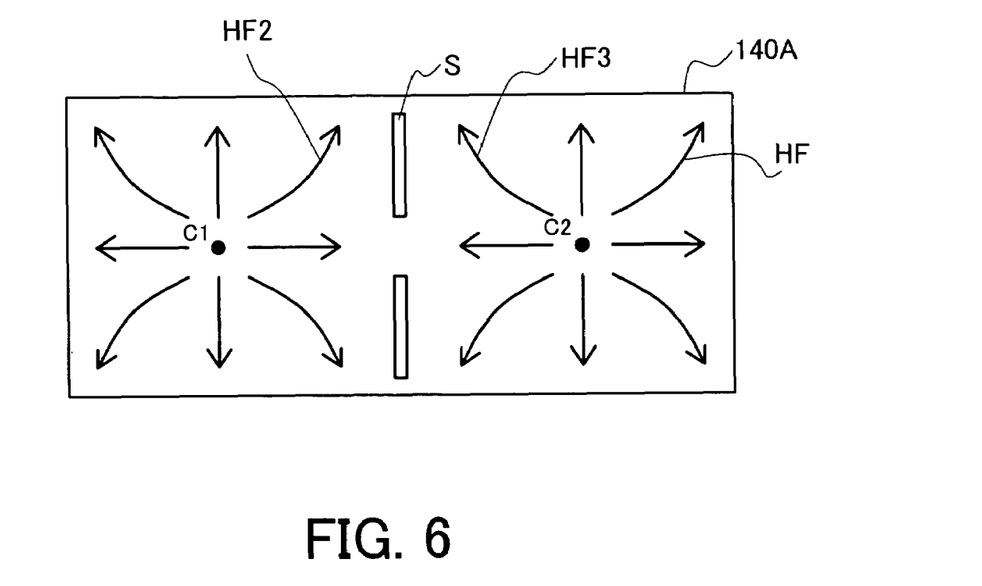
FIG. 6 is a schematic plane view of the heat spreader commonly used for plural heat sources.

The package board 110 can be mounted with plural exoergic elements (for example, a CPU and a chipset or plural CPUs) and the heat spreader can be commonly used for the plural exoergic elements. In this case, the heat flux is a composite heat flux formed on the heat spreader 140 by the plural exoergic elements. For example, when the heat flux from two heat sources $C_1$ and $C_2$ is formed on the heat spreader 140A as shown in FIG. 6, the slits S that are arranged as shown in FIG. 6 preferably follow heat fluxes HF2 and HF3. While FIG. 6 assumes that these two heat sources $C_1$ and $C_2$ have approximately the same calorific value, if one of the calorific values is larger the slits S may incline or deform accordingly.

While the heat spreader 140 is a rectangular plate in this embodiment, it may have an arbitrary shape, such as a downwards convex. The heat spreader 140 can be made of two or more components, and the slits are formed one or more of the components so that the thermal stress applied to the CPU 102 can reduce.

Figure 7:
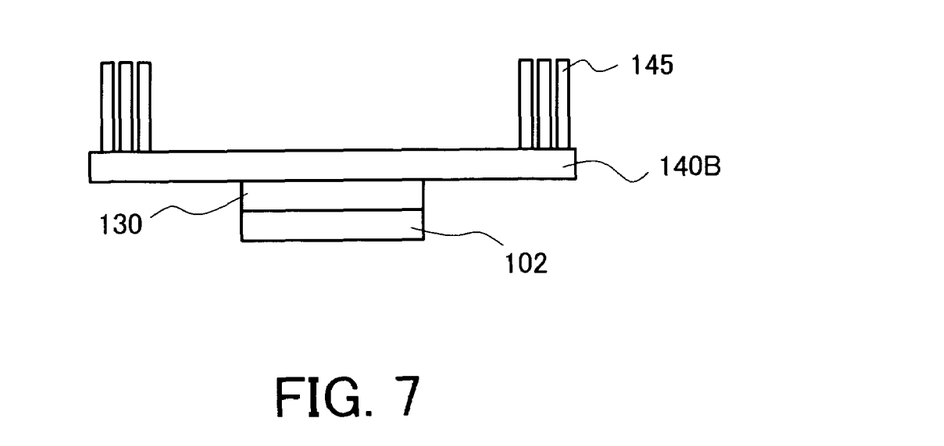
FIG. 7 is a schematic sectional view as a variation of FIG. 4A.

The heat spreader 140 may serve as part of a heat sink that naturally radiates the heat. For example, the heat spreader 140B may be provided with fins 145, as shown in FIG. 7. Here, FIG. 7 is a variation of FIG. 4A. Because the heat spreader 140B is slit so that it may easily deform, the plate fins 145 are formed at both ends of the heat spreader 140B so that the plate fins 145 may not prevent deformations of the heat spreader 140B. Of course, if the plate fins 145 do not originally preclude the deformation of the heat spreader 140B, for example, because the plate fins 145 have a needle shape, etc., the fins 145 may be formed above the CPU 102.

Because the slit 144 assists the heat spreader 140 in deforming, the slit does not have to be provided if the heat spreader 140 is made of an elastic member. The present invention does not preclude the heat spreader 140 from being made of an elastic material having a higher coefficient of thermal conductivity than that of CPU 102.

The package 100 of the instant embodiment further includes the heat sink 150, and the heat spreader 140 is jointed to the heat sink 150 so that the heat spreader 140 is deformable. For example, in attaching the heat sink 150, a dispenser applies, in a radial direction, the thermal grease or compound onto a surface of the heat sink 150 at the side of the heat spreader 140. Next, an applied surface of the heat sink 150 is placed on the heat spreader 140.

The heat spreader 140 and the heat sink 150 have approximately similar jointing areas, such as 16 $cm^2$m and the jointing area is four times as large as the jointing area, such as 4 $cm^2$, between the CPU 102 and the heat spreader 140. Therefore, the jointing material between the heat spreader 140 and the heat sink 150 does not necessarily have a coefficient of thermal conductivity similar to that of the jointing layer 130. If both members are strongly adhered to each other, the heat sink 150 undesirably precludes the heat spreader 140's deformations through the slits 144.

If necessary, a pressure mechanism, such as a spring, compresses the heat sink 150 against the heat spreader 140 so as to enhance the adhesion between them but not to break the CPU 102.

The heat sink 150 has a base and cooling fins. The base is a plate composed, for instance, of aluminum, copper, aluminum nitride, artificial diamond, plastic, or other materials of high thermal conductivity, and connected to the heat spreader 140. The heat sink 150 is manufactured by sheet metal working, aluminum die casting, or other processes. The housing 120, if made of plastic, may be formed, for example, by injection molding. The cooling fins include many aligned plate-shaped fins, and form a convex portion to increase a surface area thereof, thereby enhancing dissipating effects. However, the shape of the cooling fin is not limited to one like a plate, and any arrangement shapes like a pin, a curve, etc. may be adopted. The cooling fins do not necessarily have to be aligned horizontally at a regular interval, but may be placed radially or obliquely with respect to the base. Moreover, the number of the cooling fins may be set arbitrarily. The cooling fins are preferably made of a material of high thermal conductivity, such as aluminum, copper, aluminum nitride, artificial diamond, and plastic. The cooling fins are formed by molding, a press fit, brazing, welding, injection molding, or the like.

Figure 8:
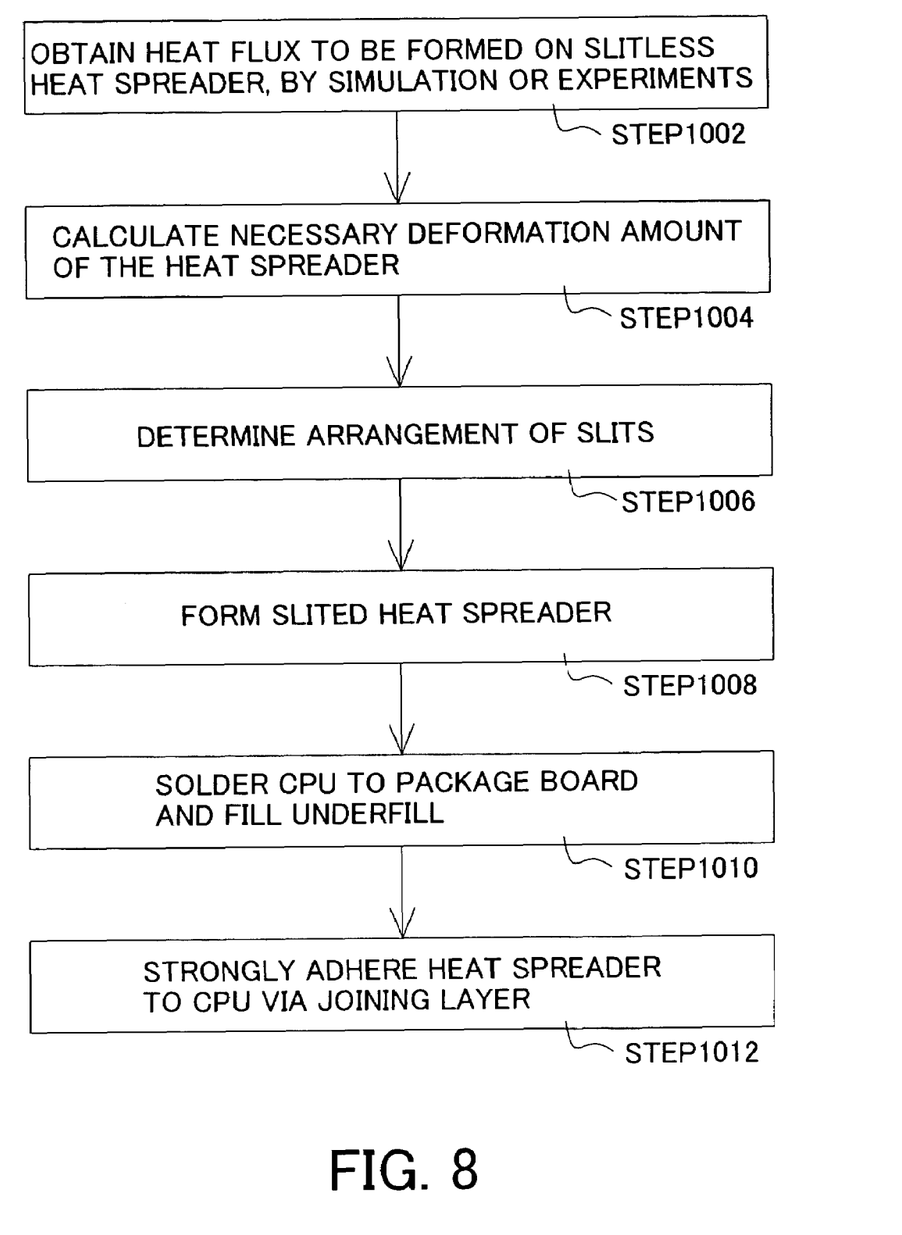
FIG. 8 is a flowchart for explaining a manufacturing method of a package module shown in FIG. 3.

A description will now be given of a method for manufacturing the package module 100, with reference to FIG. 8. Here, FIG. 8 is a flowchart showing a manufacturing method of the package module 100. First, the heat flux formed on the slitless heat spreader is obtained by a simulation or experiment (step 1002). Next, the deformation amount of the heat spreader 140 is calculated in order to reduce the thermal stress applied to the CPU 102 (step 1004). Next, an arrangement of the slits 144 is determined based on the heat flux, the necessary deformation amount of the heat spreader 140, and the permissible radiation efficiency loss (step 1006). Next, the heat spreader 140 is formed by cutting a sheet into a predetermined size after the slits 144 are formed in the sheet metal by punching etc (step 1008).

Next, the CPU 102 is soldered onto the package board 110 by the bumps 104, and the underfill 106 is filled between the CPU 102 and the package board 110 (step 1010). Next, the CPU 102 is strongly adhered to the heat spreader 140 via the jointing layer 130 (step 1012). For example, the step 1012 heats up to 150° C. and hardens the jointing layer 130, and then returns to the room temperature. Then, the heat spreader 140 deforms through the slits 144, and the thermal stress applied to the CPU 102 reduces. As a consequence, the CPU 102 is protected from breakdown, and the package 100 can be manufactured with good yield.

In operation of the electronic apparatus 300, the CPU 102 generates heat but the slits 14 are formed along the heat fluxes and do not significantly preclude the heat radiation effect by the heat spread 140 and the heat sink 150. The heat spreader 140 can maintain high heat spread performance, and the heat sink 150 properly radiates the heat generated from the CPU 102. The cooling fins of the heat sink 150 are cooled by the cooling fan installed in the fan module 320. The electronic apparatus 300 can maintain the stable operations of the CPU 102 by protecting the electronic circuit in the CPU 102 from thermal breakdown.

Further, the present invention is not limited to these preferred embodiments, and various modifications and changes may be made in the present invention without departing from the spirit and scope thereof. For example, the inventive electronic apparatus is not limited to a rack mount type server, but is applicable to a bookshelf type. It is not limited to a server, and is applicable to a PC, a network device, a PDA, and other peripherals. The inventive package module is applicable to a Land Grid Array ("LGA") package that is connected to a printed board via a LGA socket and other packages, such as a Pin Grid Array ("PGA") package. The inventive package module is applicable to an exoergic element that does not serve as a CPU, such as a chipset.

Thus, the present invention provides a semiconductor package, a printed board having the semiconductor package, and an electronic apparatus, which thermally protects the exoergic element and jointing layer due to the thermal stress associated with the junction with the heat spreader, while maintaining the heat radiation effect for the exoergic element.

What is claimed is:

1. A semiconductor package that can be mounted on a printed board, said semiconductor package comprising:
   a package board that is mounted with an exoergic circuit element;
   a heat spreader that transmits heat from the exoergic circuit element; and
   a jointing layer that is located between the exoergic circuit element and said heat spreader, joints the exoergic circuit element to said heat spreader, and is made of a solid jointing material that has substantially no elasticity,
   wherein said heat spreader includes a first surface jointed to the exoergic circuit element, and a second surface as a rear surface of the first surface, and
   wherein said heat spreader has a slit that extends in a substantially radial direction from an inner side of a first area to an outer side of the first area, the first area being jointed to the exoergic circuit element on the first surface or a second area that is an orthogonal projection of the first area onto the second surface, when said heat spreader is transparently viewed from the first or second surface.

2. A semiconductor package according to claim 1, wherein there are plural slits that are arranged substantially symmetrical with respect to a center of the exoergic circuit element.

3. A semiconductor package according to claim 1, wherein the slit perforates through said heat speader.

4. A semiconductor package according to claim 1, wherein the slit has a substantially cross or asterisk shape in said heat spreader when viewed from the first or second surface.

5. A semiconductor package according to claim 1, wherein the slit is spaced from a center of the exoergic circuit element by a predetermined distance.

6. A semiconductor package according to claim 1, wherein the slit substantially follows heat flux of the heat, formed on said heat spreader.

7. A semiconductor package according to claim 6, wherein said package board is mounted with plural exoergic circuit elements, said heat spreader is commonly used for the plural exoergic circuit elements, and the heat flux is a composite heat flux formed on said heat spreader by the plural exoergic circuit elements.

8. A semiconductor package according to claim 1, wherein said heat spreader serves as part of a heat sink that naturally radiates the heat.

9. A semiconductor package according to claim 1, further comprising a heat sink that naturally radiates the heat, and said heat spreader is jointed to said heat sink so that said heat spread can deform.

10. A semiconductor package according to claim 1, wherein said semiconductor package has a ball grid array structure.

11. A printed board mounted with a semiconductor package according to claim 1.

12. An electronic apparatus comprising a printed board mounted with a semiconductor package according to claim 1.

* * * * *